United States Patent [19]

Doemens et al.

[11] Patent Number: 4,600,878

[45] Date of Patent: Jul. 15, 1986

[54] APPARATUS FOR TESTING ELECTRICAL MICROPRINTED CIRCUITS UTILIZING IONIZING GAS FOR PROVIDING ELECTRICAL CONNECTIONS

[75] Inventors: Guenter Doemens, Holzkirchen; Peter Mengel, Eichenau, both of Fed. Rep. of Germany

[73] Assignee: Siemens Aktiengesellschaft, Berlin & Munich, Fed. Rep. of Germany

[21] Appl. No.: 511,233

[22] Filed: Jul. 6, 1983

[30] Foreign Application Priority Data

Aug. 25, 1982 [DE] Fed. Rep. of Germany ....... 3231598

[51] Int. Cl.⁴ .................. G01R 31/02; G01R 15/12
[52] U.S. Cl. ................................ 324/51; 324/73 PC
[58] Field of Search ............... 324/73 PC, 62, 54, 51, 324/158 P, 158 F, 64

[56] References Cited

U.S. PATENT DOCUMENTS 3,096,478  7/1963  Brown ................................ 324/54
4,186,338  1/1980  Fichenbaum ................. 324/73 PC

FOREIGN PATENT DOCUMENTS 1316108  5/1973  United Kingdom ........... 324/73 PC

OTHER PUBLICATIONS

Bohlen et al., Tester for Electric Conductors, IBM Technical Disclosure Bulletin, vol. 14, No. 5, p. 1601, Oct. 1971.

Primary Examiner—Gerard R. Strecker
Assistant Examiner—Jack B. Harvey
Attorney, Agent, or Firm—Hill, Van Santen, Steadman & Simpson

[57] ABSTRACT

An apparatus for checking electrical microprinted circuits comprising an insulating body formed with a number of openings in which electrodes are mounted and which can be aligned with circuit points on the printed circuit board and with electrodes mounted in each of the openings in the insulated body above a hollow space formed between the surface of the printed circuit board and the end of the electrodes with gas such as air or other material being within the opening such that when a voltage is applied between electrodes connected to opposite ends of a common printed circuit conductor discharge will occur through the gas to the electrodes thus allowing current to flow which can be detected to measure the conductivity of the printed circuit path.

3 Claims, 1 Drawing Figure

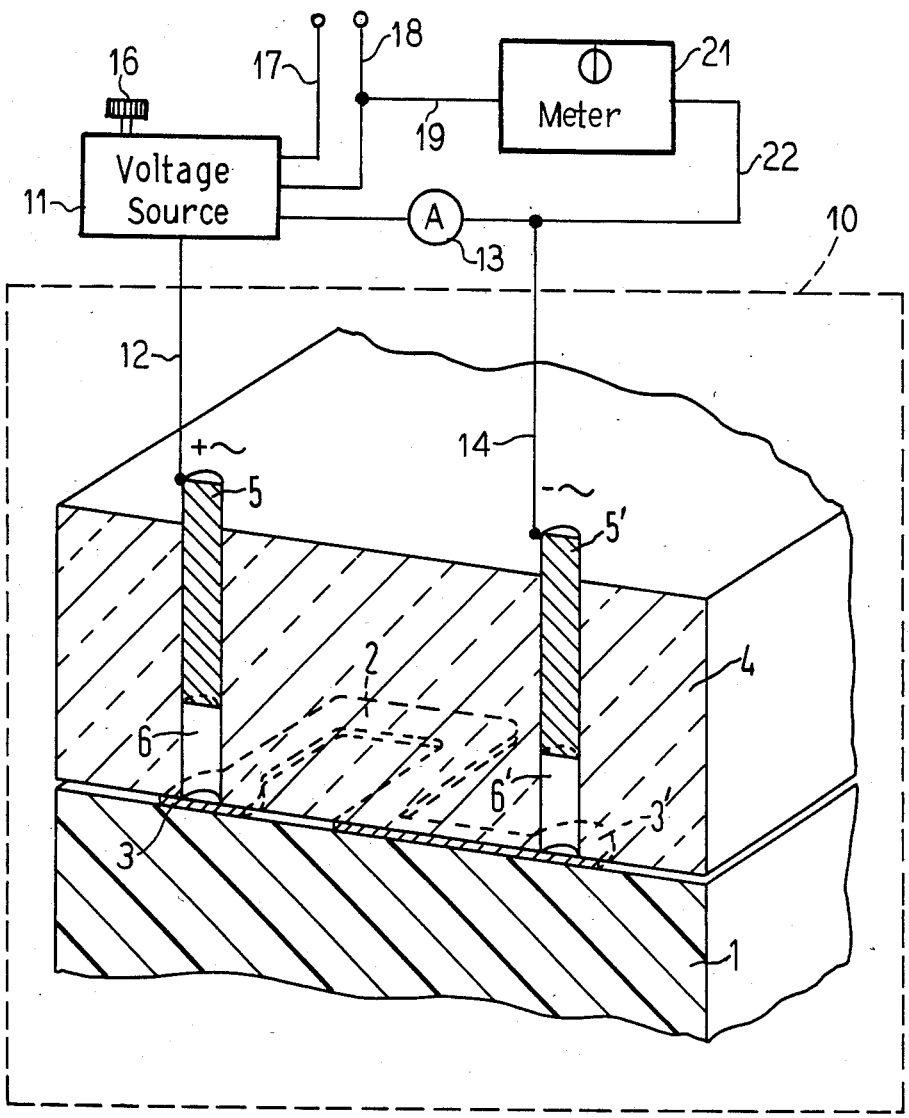

APPARATUS FOR TESTING ELECTRICAL MICROPRINTED CIRCUITS UTILIZING IONIZING GAS FOR PROVIDING ELECTRICAL CONNECTIONS

BACKGROUND OF THE INVENTION

1. Field of the Invention

This invention relates in general to an apparatus for checking printed circuit wiring which are arranged, for example, on printed circuit boards.

2. Description of the Prior Art

Extensive miniaturization in electronics has required smaller and smaller printed board circuits particularly for multiple layer circuits and this results in a decrease in size of the grid dimensions of the terminal points.

So-called needle adapters have been employed for electrically checking printed circuit boards wherein a resilient contact pin mounted in the needle adapters at each grid point in a carrier block serves as a grid member which contacts the circuit points. These prior art contacting devices consist of pins which are spring biased with separate pressure springs. The ends of the pins which contact the contact locations are shaped into a point or knife edge so as to guarantee good electrical contact. The other ends of the pins are connected to flexible electrical conductors which are connected to outer electrical terminals of the testing device.

Such testing devices have the disadvantage that due to the space requirements of the individual contact elements considerable problems occur in that in making the contacts smaller and smaller makes it difficult to mount such needle adapters. For example, with grid dimensions below 1 mm definite limits are reached for using such checking devices. The electrical checking of printed circuit boards with these small dimensions has not been successfully accomplished to the present time.

SUMMARY OF THE INVENTION

From known gas discharge displays, it is realized that local discharges can be caused to arc in very small spaces. Such gas discharges occur according to the same principle as used in a glow discharge lamp with two electrodes mounted in a glass vessel which is filled with an inert gas. A few gas atoms will be ionized due to external influences and this ionization can be increased in a known manner. A high percentage ionized gas consisting of equal quantities of free ions and electrons which is quasi-neutral is referred to as plasma. The gas is a good insulator between electrodes. When the applied voltage is increased, the glow gap is ignited. The current flowing through the gas ionizes the gas and the glow gap emits visible light.

It is an object of the present invention to provide an apparatus which is simple and which allows contact and testing to be made even for microprinted circuits with grid dimensions below 1 mm. For this purpose, the invention utilizes gas discharge techniques for testing.

The inventive method consists in that a gas discharge occurs between two grid points which are connected by means of a printed circuit conductor which is to be tested and the discharge occurs due to the application of a sufficiently high voltage to two electrodes causing a current to flow between the electrodes which is evaluated for test purposes. Also, the voltage which is applied is modulated and the current can be measured. A significant advantage of the invention is that the method can be used for very small grid spacings which cannot be tested with prior art testing adaptors. The invention also consists of a simple and reliable testing device for microprinted circuits.

So as to recognize faults when a printed circuit track is only partially interrupted for qualitative identification of the tracks resistance according to a further development of the invention, alternating voltage may be applied to the electrodes which are to be tested and the current change which results is detected in a phase-sensitive manner relative to the applied alternating voltage. In this manner, even partially interrupted track or tracks which have experienced a noticeable increase of resistance due to the etching process can be recognized and identified.

Apparatus for executing the method according to the invention consists of an insulating plate which is formed with a plurality of openings that might be arranged in parallel lines and columns which correspond to the raster points of the printed circuit to be tested and each of the openings is provided with an electrode which leaves the lower portion of the opening facing the base plate free as an ignition chamber for the gas discharge. The ignition chamber is filled with a gas under a specific pressure and the insulating plate is pressed tightly against the printed circuit which is to be tested in a gas atmosphere which has reduced pressure such that the ignition chambers are mounted directly above the grid points of the printed circuit wiring. Testing apparatuses of the invention can be produced in a simple manner using lithography as well as physical chemical processes of semiconductor technology and, thus, the testing device can be simply and economically produced.

The driving of gas discharge displays is a well developed art and the electronics and drivers for such prior art display systems can be used to drive the testing device of the present invention.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

The FIGURE comprises a schematic partially sectional view of the testing apparatus of the invention.

DESCRIPTION OF THE PREFERRED EMBODIMENTS

A printed circuit board 1 carries printed circuit tracks 2 on its surface which terminate in solder eyes 3 and 3' for example. An insulating member 4 is formed with a number of openings 6 and 6' which are aligned with the solder eyes 3 and 3' for example. The insulating member 4 can be pressed against the printed circuit board 1 such that the openings 6 and 6' align with the solderized 3 and 3' as shown. It is to be realized that only two openings 6 and 6' are illustrated in the FIGURE, but there may be many such openings for testing continuity between many solder eyes for many printed circuit tracks. Electrodes are received in each of the openings and an electrode 5 extends partially into the opening 6 and an electrode 5' extends partially into the opening 6' as shown. It is to be noted that the inner ends of the electrodes 5 and 5' do not extend flush with the surface of the member 4 which engages the printed circuit board 1 but they are recessed in the openings 6 and 6' so that a space exists between the end of the electrode 5 and the solder eye 3. The arrangement may be mounted in a gas tight container 10 and a gas such as air, neon, argon or other suitable gas is mounted in the container 10 and is reduced to a pressure below atmospheric as for example a few Torr.

It is to be realized that the insulating bodies 4 with the openings 6 and 6' and the electrodes 5 and 5' have openings arranged so that they specifically match the specific printed circuit 1 which is to be tested and such that an opening 6, 6' will mate with the associated solder eye 3, 3' of the printed circuit board. It is also conceivable that the insulating body may have many openings and only certain of the openings contain electrodes so that testing of a particular printed circuit board can occur.

The container 10 allows the testing device to be sealed from outside air pressure and it can be filled with a gas such as air. A specific reduced pressure relative to normal pressure is then produced in the vacuum system and this pressure is based on the applied voltage which will be applied between the electrodes 5 and 5' as well as the type of gas employed as well as the dimensions of the ionization chambers 6 and 6' between the bottom ends of the electrodes 5 and 5' and the printed circuit board eyes 3 and 3'. After the pressure has been suitably adjusted within the chamber 10 the insulating member 4 is placed on the printed circuit board with the openings 6 and 6' aligned with the test points 3 and 3' and the electrical check is accomplished by applying a suitable voltage between the electrodes 5 and 5'. Such applied voltage when applied to electrodes 5 and 5' that are connected by conductive path 2 as soon as the ignition voltage of the gas is exceeded two gas discharges will be ignited in the openings 6 and 6' and current can be measured which flows between the electrodes 5 and 5' through the printed circuit track 2. This current can be recorded in a suitable manner as, for example, with a suitable ammeter 13. A suitable voltage from a voltage source 11 is applied to the electrodes 5 and 5' by the leads 12 and 14 and the ammeter 13 is in series between the anode so as to measure the current which flows through the electrodes. The voltage source 11 may be adjusted with a suitable knob 16. The voltage source may be connected to a suitable AC source by leads 17 and 18 and a lead 19 is connected to a phase meter 21 which is connected by lead 22 to the electrode 5'. The phase-sensitive modulation method can be utilized for measuring the electrical resistance of the printed circuit path 2. It also is to be realized that either the DC or AC voltage or a combination of AC voltage superimposed on DC voltage may be applied to the electrodes 5 and 5'.

The apparatus according to the invention is not limited to grid dimensions below 1 mm but it could also be used in larger dimension devices wherein the prior art adapter devices can be marginally used.

Although the invention has been described with respect to preferred embodiments, it is not to be so limited as changes and modifications may be made therein which are within the full intended scope as defined by the appended claims.

We claim as our invention:

1. A testing device for testing circuit paths on a printed circuit comprising a plate of insulation formed with a plurality of openings which are aligned with the ends of the circuit paths on said printed circuit, a plurality of electrodes with an electrode partially extending into each one of said plurality of openings, a direct-current voltage source connected to pairs of said plurality of electrodes such that a direct-current voltage can be applied to opposite ends of a circuit path on said printed circuit, means for applying an alternating-current voltage to said electrodes such that an alternating-current voltage can be superimposed on said direct-current voltage, an ionizing gas within said plurality of openings between the electrodes and the ends of the circuit paths, and means for measuring the alternating-current flow due to the applied alternating-current voltage between pairs of said electrodes which are connected to opposite ends of said circuit paths.

2. Apparatus according to claim 1, wherein the means for measuring the alternating-current flow includes the detection of the current change which results in a phase sensitive manner relative to the applied alternating-current voltage.

3. Apparatus according to claim 2 including means for measuring the phase between the alternating-current and the applied voltage to said electrodes.

* * * * *